US005563557A

United States Patent [19]

Sasaki

[11] Patent Number: 5,563,557
[45] Date of Patent: Oct. 8, 1996

[54] ATTENUATOR HAVING A PLURALITY OF CURRENT SOURCE CIRCUITS

[75] Inventor: Tadahiro Sasaki, Tokyo-to, Japan

[73] Assignee: Kabushiki Kaisha Toshiba, Kawasaki, Japan

[21] Appl. No.: 411,578

[22] Filed: Mar. 28, 1995

[30] Foreign Application Priority Data

Mar. 28, 1994 [JP] Japan ................................. 6-056896
Jan. 27, 1995 [JP] Japan ................................. 7-011882

[51] Int. Cl.$^6$ ....................................... H03H 7/24
[52] U.S. Cl. ............................. 333/81 R; 327/328
[58] Field of Search .......................... 333/81 R, 81 A; 323/349–351, 353, 354, 369; 327/308, 328

[56] References Cited

U.S. PATENT DOCUMENTS 5,128,566  7/1992  Killion et al. ................ 333/81 R X
5,157,323  10/1992  Ali et al. ...................... 333/81 R X
5,309,048  5/1994  Khabbaz ....................... 333/81 A X

OTHER PUBLICATIONS

Japanese Patent Disclosure (Kokai) No. 6–69754; S. Amano: Mar. 11, 1994.
M. Higuchi et al., "Step Attenuator for Digital Mobile Telephones" Proceedings of the 1994 IEICE Spring Conference, pp. 2–622, C–117, 1994, Japan no month.
J. Bayruns et al., "A Monolithic DC–1.6GHz Digital Attenuator" IEEE MTT–S Digest, pp. 12/95—12/98, 1989 no month.

Primary Examiner—Paul Gensler
Attorney, Agent, or Firm—Foley & Lardner

[57] ABSTRACT

The attenuator device comprises a unit step attenuator 4 (having a switch FET 5, an attenuation resistor 6 connected in parallel to the switch FET 5, and two shutdown resistors 7 and 8); three current source circuits $20_1$, $20_2$ and $20_3$ (having three transfer gates $22_1$, $22_2$ and $22_3$ and three current source FETs $23_1$, $23_2$ and $23_3$ for controlling a gate current of the switch FET 5). The signal transmission loss and the layout area can be reduced as much as possible, even if various attenuation rates are required.

21 Claims, 15 Drawing Sheets

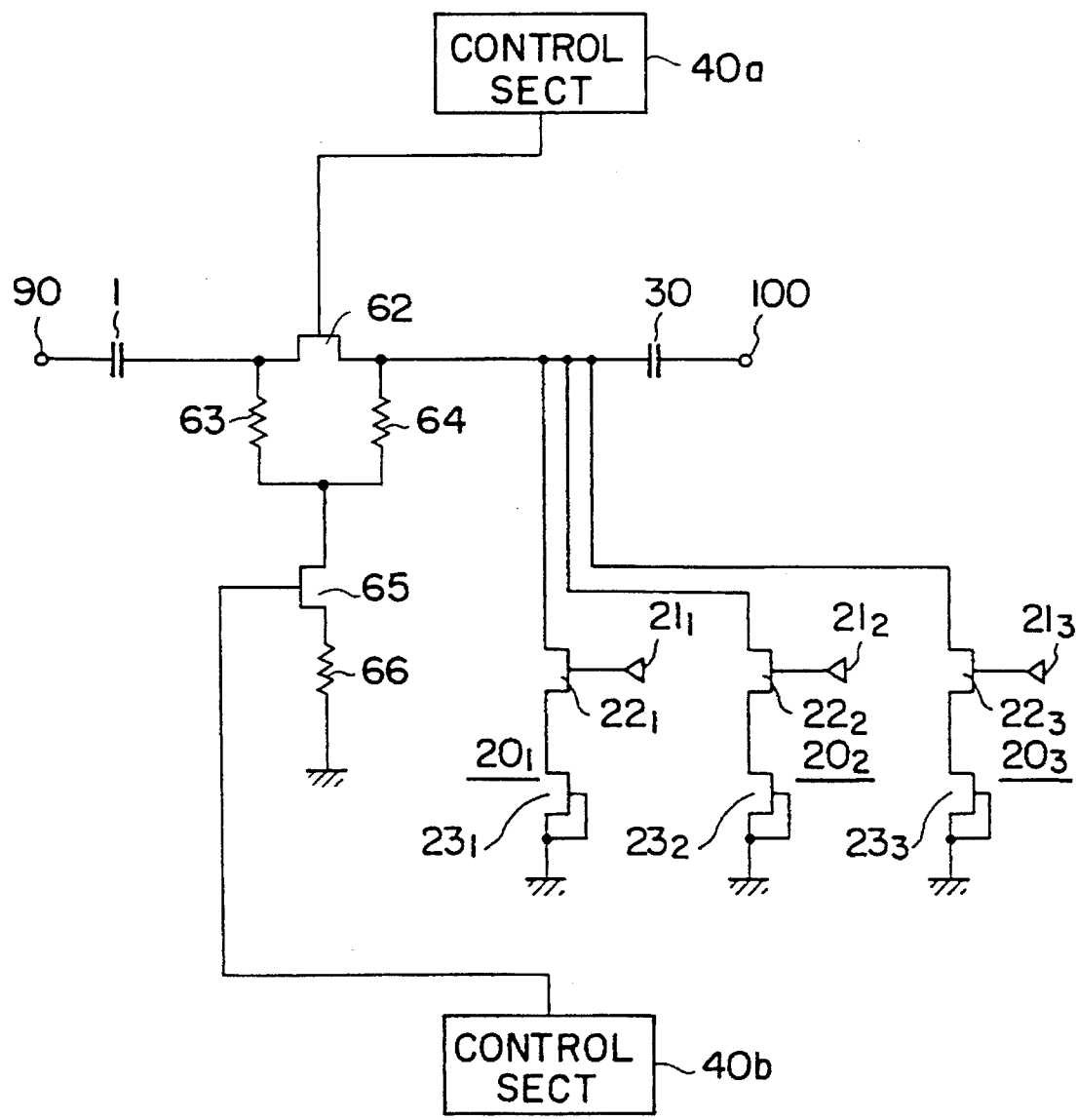
F I G. 1A

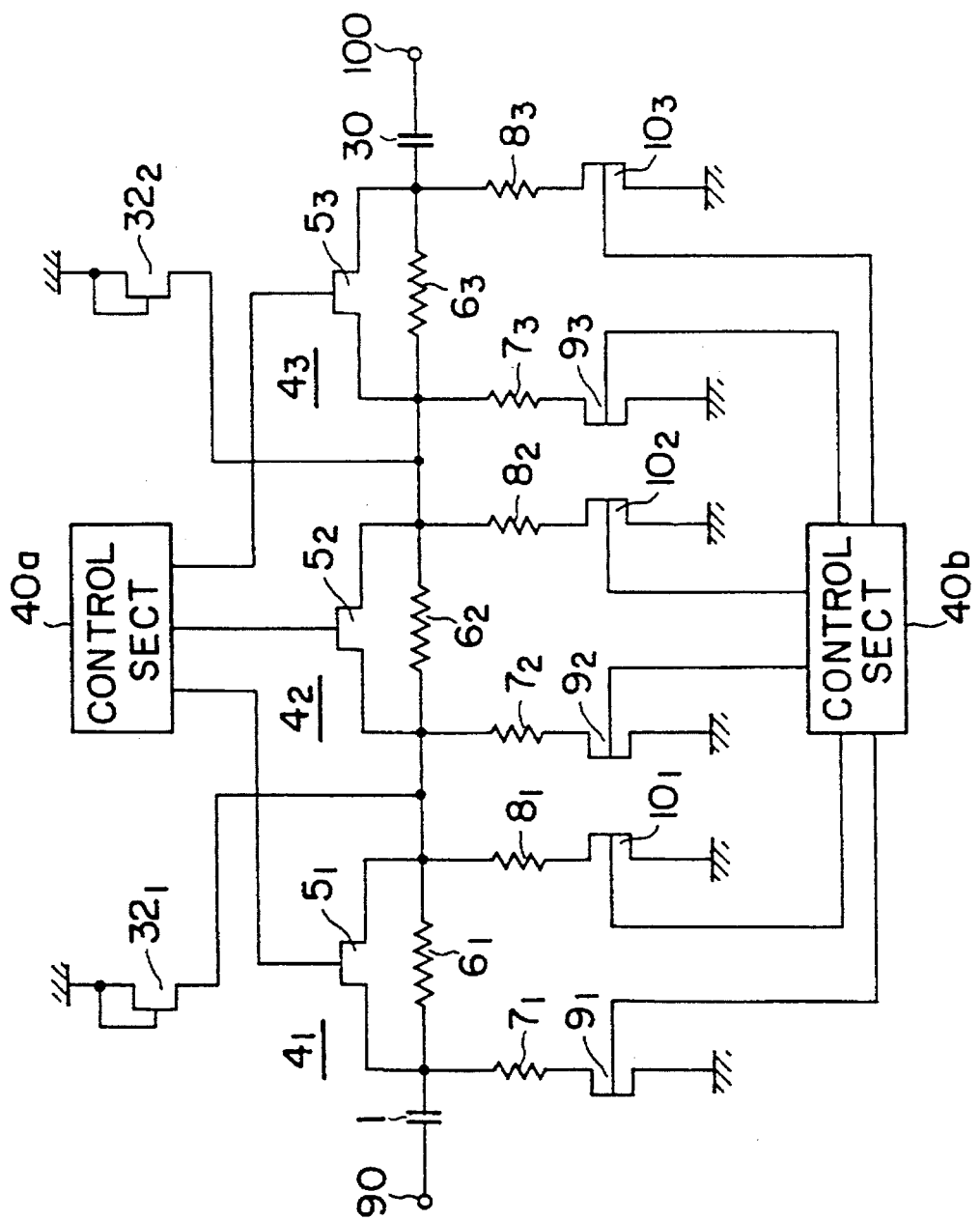
F I G. 4

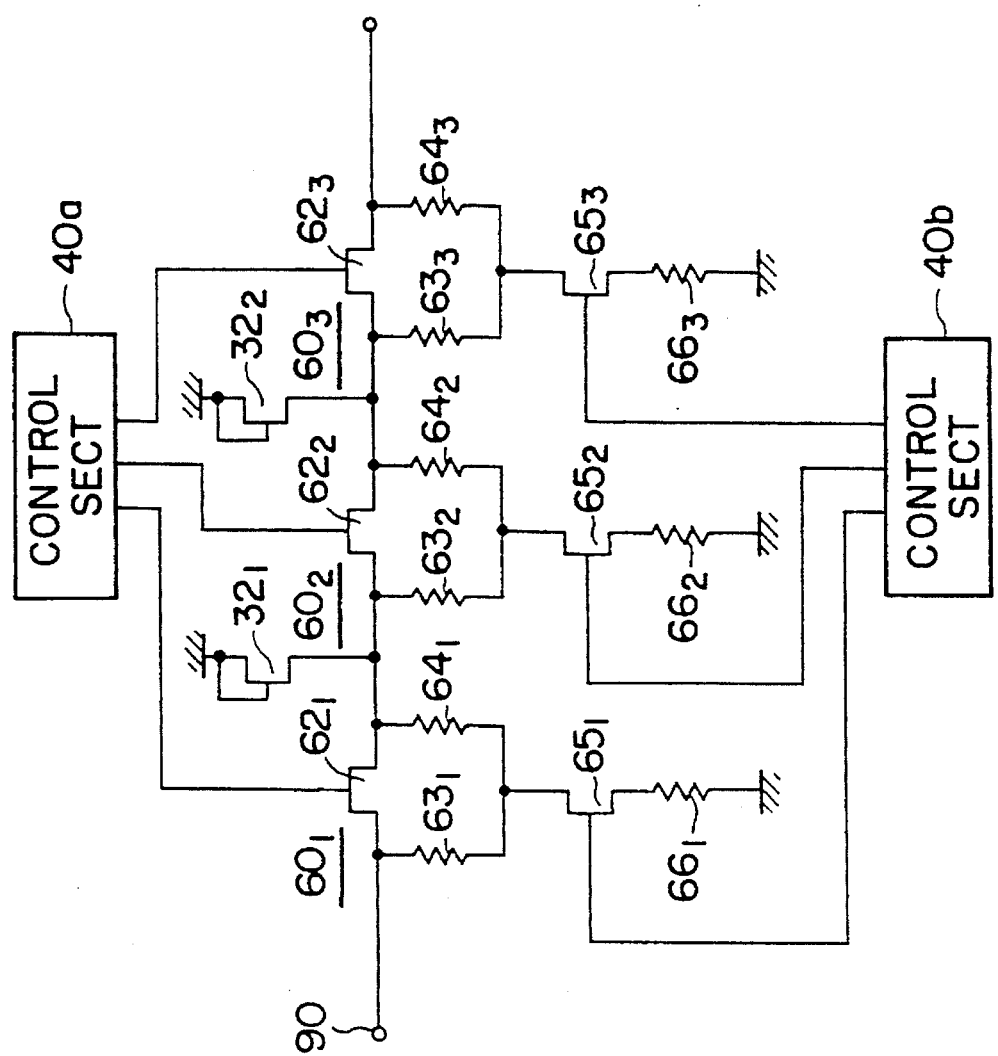
F I G. 4A

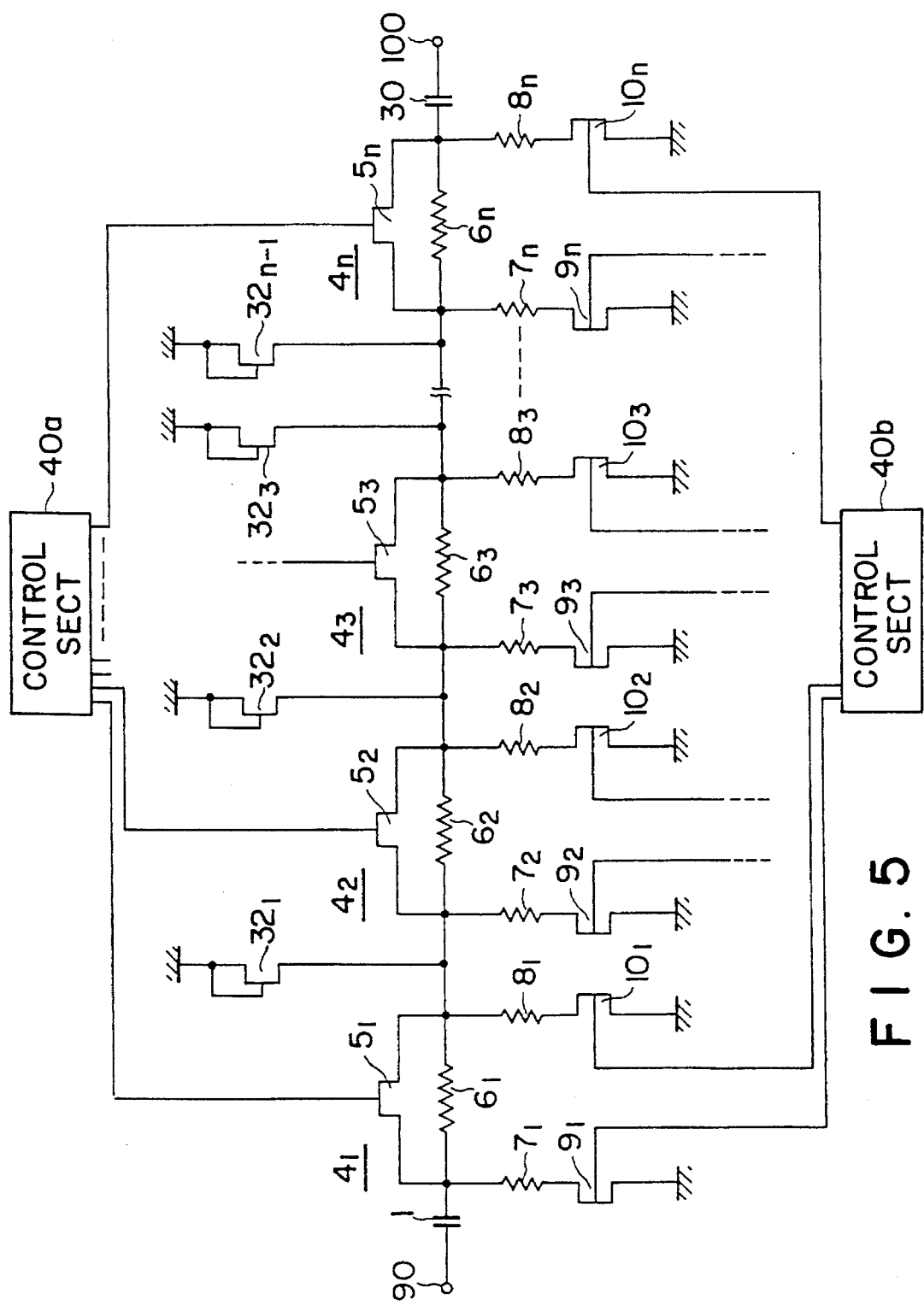
F I G. 5

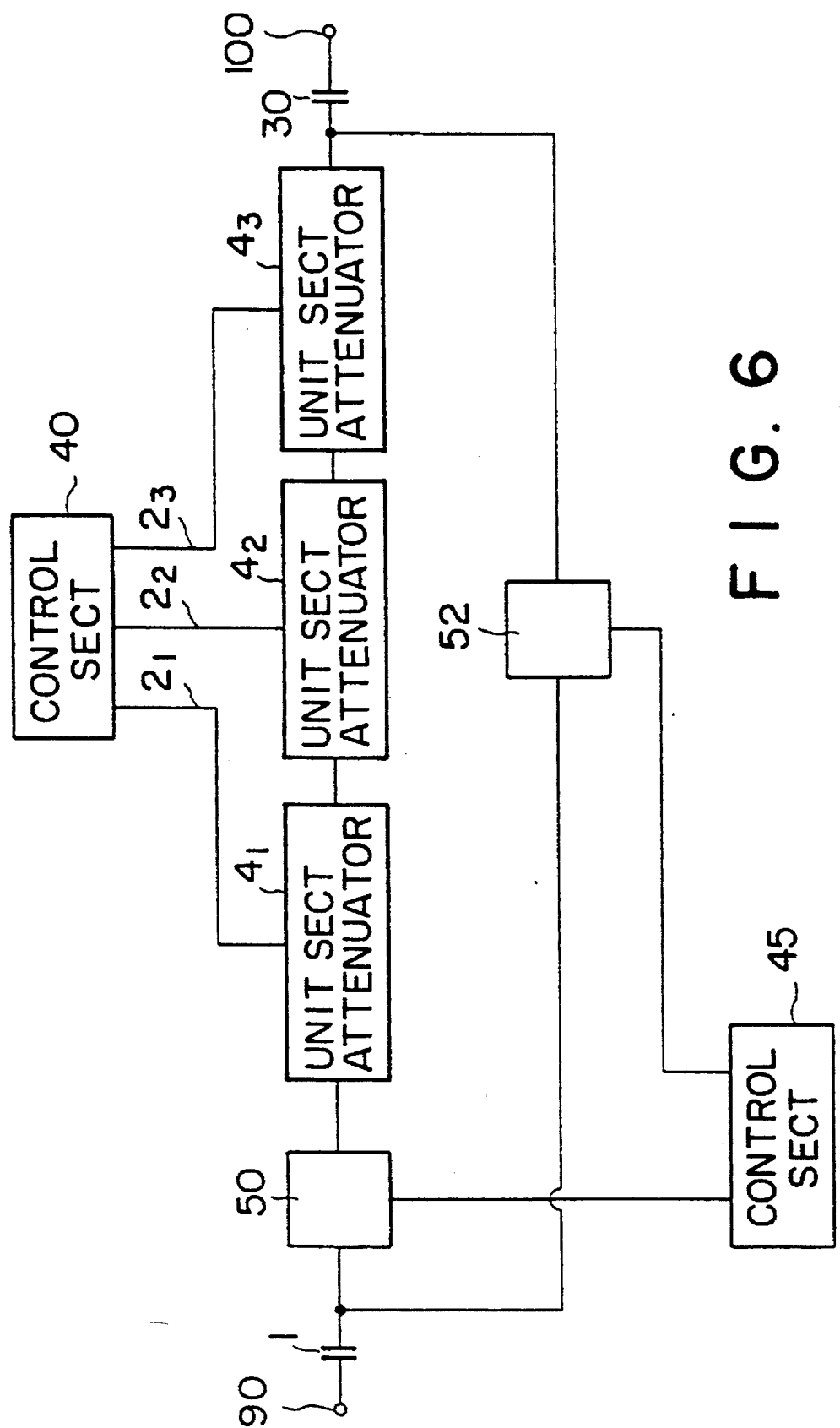
F I G. 6

ATTENUATOR HAVING A PLURALITY OF CURRENT SOURCE CIRCUITS

FIELD OF THE INVENTION

The present invention relates to an attenuator device having analog variable attenuators.

BACKGROUND OF THE INVENTION

In general, a step attenuator is used as a variable attenuator required for an analog circuit. In this case, the step attenuator is composed of a plurality ($n \geq 1$) of series-connected unit step attenuators and classified into two types of $\pi$ and T.

FIG. 9 shows an example of prior art $\pi$-type variable attenuator, in which three $\pi$-type unit step attenuators $4_1$, $4_2$ and $4_3$ are connected in series. Each unit step attenuator $4_i$ (i=1, 2 and 3) is composed of three resistors $6_i$, $7_i$ and $8_i$, a switch FET (Field Effect Transistor) $5_i$ connected in parallel to the resistor $6_i$, a high resistance resistor $3_i$ connected to a gate of the switch FET $5_i$, a transfer gate $9_i$ connected in series to the resistor $7_i$ and a transfer gate $10_i$ connected in series to the resistor $8_i$.

The attenuation rate of each unit step attenuator $4_i$ can be decided on the basis of three resistors $6_i$, $7_i$ and $8_i$ and the on/off resistance of the switch FET $5_i$. Further, when operated as the attenuator, the switch FET $5_i$ is turned off in response to a control signal inputted to the gate thereof, and the two transfer gates $9_i$ and $10_i$ are turned on in response to control signals $13_i$ and $14_i$, respectively. Further, when a RF (radio frequency) signal inputted to the input terminal 90 is only passed therethrough (without operated as the attenuator), the switch FET $5_i$ is turned off and the transfer gates $9_i$ and $10_i$ are also turned off. Therefore, when assumption is made that the attenuation rates of the unit step attenuators $4_1$, $4_2$ and $4_3$ are 4 dB, 8 dB and 16 dB, respectively, if only the unit step attenuator $4_1$ is operated as the attenuator and other two unit step attenuators $4_2$ and $4_3$ are not operated as the attenuators, the RF signal inputted to the input terminal 90 is attenuated by 4 dB at an output terminal 100. Further, when only the step attenuators $4_1$ and $4_2$ are operated as the attenuators, the attenuation rate is 12 dB (=4 dB+8 dB); when only the step attenuators $4_1$ and $4_3$ are operated as the attenuators, the attenuation rate is 20 dB (=4 dB+16 dB); and when all the step attenuators $4_1$, $4_2$ and $4_3$ are operated as the attenuators, the attenuation rate is 28 dB (= 4 dB+8 dB+16 dB).

As described above, it is possible to obtain various attenuation rates of 4, 8, 12, 16, 20, 24 and 28 dB, respectively by combining the three unit step attenuators appropriately.

Further, in FIG. 9, control signals $2_1$, $2_2$ and $2_3$; $13_1$, $13_2$ and $13_3$; and $14_1$, $14_2$ and $14_3$ are applied by a control section (not shown), and the capacitors 1 and 30 are of dc cut-off capacitor.

Further, FIG. 10 shows an example of prior art T-type variable attenuator, in which four T-type unit step attenuators $60_1$, $60_2$, $60_3$, and $60_4$ are connected in series. Each unit step attenuator $60_i$ (i=1, 2, 3 and 4) is composed a switch FET $62_i$, a high resistance resistor $68_i$ connected to the gate of the switch FET $62_i$, a transfer gate $65_i$, three resistors $63_i$, $64_i$ and $66_i$ arranged into T-shape via the transfer gate $65_i$, and a resistor $67_i$ connected to the gate of the transfer gate $65_i$. Further, a series circuit of the two resistors $63_i$ and $64_i$ is connected in parallel to the switch FET $62_i$.

In this T-type attenuator, it is possible to change the attenuation rate by combining the four unit step attenuators $60_1$, $60_2$, $60_3$ and $60_4$ appropriately.

Further, the reason why a high resistance resistor $68_i$ is connected to the gate of the switch FET $62_i$ in FIG. 10 (or a high resistance resistor $3_i$ is connected to the gate of the switch FET $5_i$ in FIG. 9) is to reduce the gate current of the FET (because the FET is of voltage drive type) and to suppress the influence of the control section.

In the prior art attenuator, as described above, the attenuation rate can be determined by combining a plurality of unit step attenuators, because the attenuation rate thereof can be decided on the basis of the attenuation resistor and the on/off resistance of the switch FET connected in parallel to the attenuation resistor. As a result, when a plurality of attenuation rates are required, the number of unit step attenuators, that is, the number of switch FETs must be increased with increasing number of sorts of attenuation rates. On the other hand, when a signal transmission loss is defined as a loss determined when an RF signal is passed through the attenuator device under the condition that the variable attenuator is not operated (i.e., the switch FETs are kept turned on), since the transmission loss is caused by the turn-on resistance of the switch FETs, there exists a problem in that the larger the number of the required attenuation rates is, the larger will be the signal transmission loss.

To overcome this problem, it is possible to increase the gate width of the switch FET so that the turn-on resistance can be reduced when the RF signal is transmitted from the drain to the source of the switch FET. In this case, however, when the gate width of the FET increases, since the layout area thereof increases and further the parasitic capacitance of the FET also increases, another problem arises in that the frequency characteristics deteriorate.

Further, when the attenuation rate error of the unit step attenuator results from the dispersion (difference) of the switch FET characteristics caused during the manufacturing process, when the number of the unit step attenuators increases, since the maximum attenuation rate error obtained by adding all the attenuation rate errors of all the unit step attenuators also increases, there exists the other problem in that the attenuation rate selectable by the variable attenuator also differs. For instance, in the case of the example shown in FIG. 9, if the attenuation error (dispersion) of each unit step attenuator $4_i$ is assumed to be ±0.5 dB, the attenuation error is ± 0.5 dB when the attenuation rate of the variable attenuators are 4, 8, and 16 dB respectively; ±1.0 dB when the attenuation rate thereof are 12, 20, and 24 dB respectively; and ±1.5 dB when the attenuation rate thereof is 28 dB.

Therefore, the system design has been so far complicated by the non-linear characteristics of the respective attenuation rates of the respective unit step attenuators. On the other hand, in order to overcome the problem related to the non-uniformity of the attenuation rate error, it may be possible to increase the number of unit step attenuators or to provide a new unit step attenuator having the maximum attenuation rate (e.g., 28 dB). In this case, however, there arises another problem in that the layout area increases and thereby the signal transmission loss increases, as already explained.

SUMMARY OF THE INVENTION

With these problems in mind, therefore, it is the object of the present invention to provide an attenuator device which can prevent the signal transmission loss and the layout area from being increased as much as possible, even if the number of attenuation rates increases.

To achieve the above-mentioned object, the present invention provides an attenuator device, comprising: an input terminal (90); an output terminal (100); one unit step attenuator (4 or 60) having a switch FET (5 or 62) connected between said input and output terminals (90, 100), a control terminal of the switch FET being connected directly to a control signal terminal without intervening a resistor; and a plurality of current source circuits (20) each for turning on/off an output side of said FET (5 or 62) through a current path of a predetermined size, at a supply voltage terminal thereof, to control gate current flowing through said FET, any one of or a plurality of said current source circuits being turned on independently or simultaneously.

Here, said unit step attenuator (4) is of π type and which comprises: a first resistor (6) connected between said input terminal (90) and said output terminal (100); a second resistor (7) connected between an input side of said first resistor (6) and the supply voltage terminal; and a third resistor (8) connected between an output side of said first resistor and the supply voltage terminal.

Here, said unit step attenuator (60) is of T type and which comprises: a first resistor (63) connected to an input side of said FET (62) at one end thereof; a second resistor (66) connected to an output side of said FET (62) at one end thereof; and a third resistor (65) connected to the other ends of said first and second resistors (63, 64) in common at one end thereof, and connected to the supply voltage terminal at the other end thereof.

Here, a plurality of said current source circuits (20) have current paths of predetermined different sizes, respectively.

Here, a plurality of said current source circuits (20) have current paths of predetermined different sizes, respectively, the number of current source circuits having the current path of a certain size is one or plural.

Here, each of said current source circuits (20) is a series circuit of a switching element (22) and a normally-on transistor (23), the size of the current path being determined by said normally-on transistor (23).

Here, switching elements (9, 10) are connected in series to said resistors (7, 8), respectively.

Here, a switching element (65) is connected in series to said resistor (66).

Further, the present invention provides an attenuator device, having: a plurality of attenuator units (U) connected in series sequentially, each of said attenuator unit (U) comprises: an input terminal (90); an output terminal (100); one unit step attenuator (4 or 60) having a switch FET (5 or 62) connected between said input and output terminals (90, 100), a control terminal of the switch FET being connected directly to a control signal terminal without intervening a resistor; and a plurality of current source circuits (20) each for turning on/off an output side of said FET (5 or 62) through a current path of a predetermined size, at a supply voltage terminal thereof, to control gate current flowing through said FET, any one of or a plurality of said current source circuits being turned on independently or simultaneously.

Here, said unit step attenuator (4) is of π type and which comprises: a first resistor (6) connected between said input terminal (90) and said output terminal (100); a second resistor (7) connected between an input side of said first resistor (6) and the supply voltage terminal; and a third resistor (8) connected between an output side of said first resistor and the supply voltage terminal.

Here, said unit step attenuator (60) is of T type and which comprises: a first resistor (63) connected to an input side of said FET (62) at one end thereof; a second resistor (66) connected to an output side of said FET (62) at one end thereof; and a third resistor (65) connected to the other ends of said first and second resistors (63, 64) in common at one end thereof, and connected to the supply voltage terminal at the other end thereof.

Further, the present invention provides an attenuator device, comprising: an input terminal (90); an output terminal (100); a plurality of one unit step attenuators (4 or 60) connected in series between said input terminal (90) and said output terminal (100) and each having a switch FET (5 or 62) connected between said input and output terminals (90, 100), a control terminal of the switch FET being connected directly to a control signal terminal without intervening a resistor; and a plurality of pull down circuits (32) connected between a junction point between said two unit step attenuators ($4_i$, $4_{i+1}$) and a supply voltage terminal, for controlling on/off resistance of said FET so that gate current flowing through said FET can be controlled.

Here, said unit step attenuator (4) is of π type and which comprises: a first resistor (6) connected between said input terminal (90) and said output terminal (100); a second resistor (7) connected between an input side of said first resistor (6) and the supply voltage terminal; and a third resistor (8) connected between an output side of said first resistor and the supply voltage terminal.

Here, said unit step attenuator (60) is of T type and which comprises: a first resistor (63) connected to an input side of said FET (62) at one end thereof; a second resistor (66) connected to an output side of said FET (62) at one end thereof; and a third resistor (65) connected to the other ends of said first and second resistors (63, 64) in common at one end thereof, and connected to the supply voltage terminal at the other end thereof.

Here, each of said pull down circuit (32) is a normally-on transistor (32).

Here, said third and fourth resistors (7, 8) are connected in series to said second and third FETs (9, 10) respectively, gate currents of said second and third FETs (9, 10) being controlled by said pull down circuit (32).

Here, a switch (65) is connected in series to said resistor (66).

Further, the present invention provides an attenuator device, comprising: an input terminal (90); an output terminal (100); at least one unit step attenuator (4); a series-connected transfer gate (50) interconnected between said input terminal (9) and said first unit step attenuator (4); and a parallel-connected bypass transfer gate (52) connected between said input and output terminals.

Here, said unit step attenuator (4) is of π type or T type.

Here, when one of said series-connected transfer gate (50) and said parallel-connected transfer gate (52) is turned on, the other thereof is turned off.

Further, the present invention provides an attenuator device, comprising: a plurality of attenuator units connected in series sequentially, each of said attenuator unit (U) comprises: an input terminal (90); an output terminal (100); at least one unit step attenuator (4); a series-connected transfer gate (50) interconnected between said input terminal (9) and said first unit step attenuator (4); and a parallel-connected bypass transfer gate (52) connected between said input and output terminals.

Here, said unit step attenuator (4) is of π type or T type.

Here, when one of said series-connected transfer gate (50) and said parallel-connected transfer gate (52) is turned on, the other thereof is turned off.

In the first aspect of the present invention, the gate current of the switch FET is controlled by the current source FETs of the current source circuits. Therefore, the attenuation rate can be decided by the unit step attenuator and the current source FETs. Therefore, the number of the attenuation rates can be increased by increasing the number of current source circuits, while reducing the signal transmission loss and the layout as much as possible.

Further, in the second aspect of the present invention, the turn-on/off resistances of the FETs can be controlled by the pull-down FETs. Therefore, it is possible to control the turn-on/off resistances of the switch FETs under consideration of the characteristic differences of the switch FETs due to fluctuations during the manufacturing process, so that the attenuation differences (due to dispersion) of the unit step attenuators can be controlled.

Further, in the third aspect of the present invention, when the unit step attenuators are used as the attenuator, the first transfer gate is turned on and the second transfer gate is turned off. Further, when the unit step attenuators are not used as the attenuator, the first transfer gate is turned off and the second transfer gate is turned on. Accordingly, the signal transmission loss is determined only by the turn-on resistance of the second transfer gate, so that even if the attenuation rate increases, the signal transmission loss can be reduced markedly, as compared with the conventional device. Further, since it is unnecessary to increase the gate width of the switch FET to reduce the signal transmission loss, being different from the conventional device, the layout area can be reduced, as compared with the conventional device.

BRIEF DESCRIPTION OF THE DRAWINGS

FIG. 1A is a circuit diagram showing a modification example in which the unit step attenuator shown in FIG. 1 is changed from the π type to T type;

FIG. 4 is a circuit diagram showing a second embodiment of the attenuator device according to the present invention;

FIG. 4A is a circuit diagram showing a modification example in which the unit step attenuator shown in FIG. 4 is changed from the π type to T type;

FIG. 5 is a circuit diagram showing a modification of the attenuator device shown in FIG. 4;

FIG. 6 is a block diagram showing a third embodiment of the attenuator device according to the present invention;

DETAILED DESCRIPTION OF THE PREFERRED EMBODIMENTS

Figure 1:
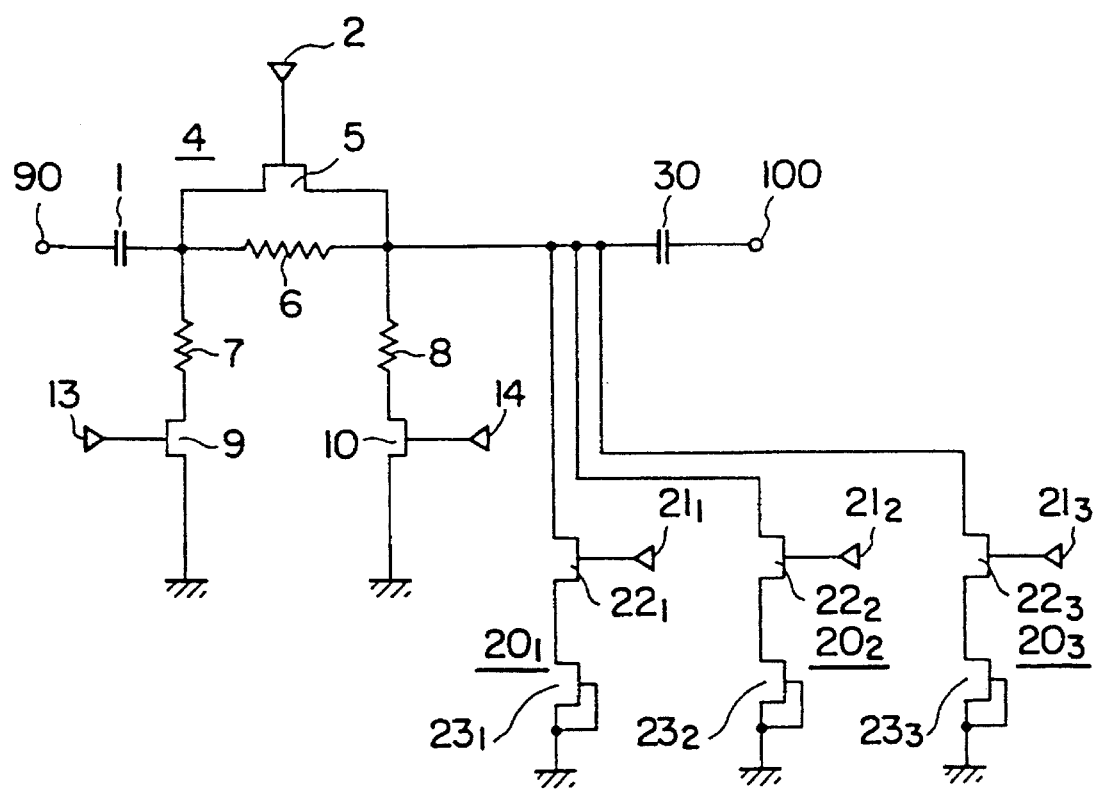
FIG. 1 is a circuit diagram showing a first embodiment of the attenuator device according to the present invention.

FIG. 1 shows a first embodiment of the attenuator device according to the present invention, which is used as a variable attenuator for an analog circuit. The attenuator device shown in FIG. 1 comprises a unit step attenuator 4, and three current source circuits $20_1$, $20_2$ and $20_3$. The unit step attenuator 4 is composed of a switch FET 5, an attenuation resistor 6 connected in parallel to the switch FET 5, two shut-down resistors 7 and 8, and two transfer gates 9 and 10 connected in series to the two shut-down resistors 7 and 8, respectively. In this circuit, the attenuation resistor 6 and the two shut-down resistors 7 and 8 are arranged into π shape. A control signal 2 inputted to the gate of the switch FET 5 is obtained by inverting a control signal 13 (or 14) inputted to the gate of the transfer gate 9 (or 10).

Each current source circuit $20_i$ (i=1, 2 and 3) is composed of a transfer gate $22_i$ and a normally-on FET $23_i$ connected in series to the transfer gate $22_i$. Further, the three current source circuits $20_1$, $20_2$ and $20_3$ are connected in parallel to each other between an output terminal 100 of the unit step attenuator 4 and ground. Further, a control signal $21_i$ is inputted to each transfer gate $22_i$. Further, the respective gate widths of the normally-on FETs $23_1$, $23_2$ and $23_3$ are different from each other.

When the control signal 2 is on so that the switch FET 5 is turned on, the control signals $21_1$, $21_2$ and $21_3$ are off. Further, when the control signal 2 is off, at least one of the control signals $21_1$, $21_2$ and $21_3$ turned on.

The operation of the attenuator device as described above will be explained hereinbelow. Now, the assumption is made that the switch FET 5 is turned on in response to the control signal 2 and the transfer gates $22_1$, $22_2$ and $22_3$ are off in response to the control signals $21_1$, $21_2$ and $21_3$, respectively. Under these conditions, an RF (radio frequency) signal applied to the input terminal 90 is inputted to the unit step attenuator 4 through a dc cut-off capacitor 1, and then outputted from the output terminal 100 through the switch FET 5 and a dc cut-off capacitor 30. In this case, the RF signal is attenuated by the resistance of the switch FET 5.

Next, in the case where the switch FET 5 is turned off and any one (e.g., the transfer gate $22_1$) of the three transfer gates $22_1$, $22_2$ and $22_3$ is turned on, since the normally-on FET $23_1$ operates as the current source, the gate current of the switch FET 5 can be controlled. Therefore, the RF signal inputted to the input terminal 90 is attenuated by the unit step attenuator 4 and then outputted from the output terminal 100 through the dc cut-off capacitor 30. In this case, the attenuation rate thereof can be determined by the π-type arranged resistors 6, 7 and 8, and the gate widths of the switch FET 5 and the normally-on FET $23_1$. Here, since the gate widths of the normally-on FETs $23_1$, $23_2$ and $23_3$ are different from each other, when the switch FET 5 is turned off, it is possible to obtain three different sorts of attenuation rates by turning on any one of the three transfer gates $22_1$, $22_2$ and $22_3$ to operate the corresponding normally-on FET as a current source. In addition, it is possible to obtain seven different sorts of attenuation rates by combining the turn-on status of the three transfer gates $22_1$, $22_2$ and $22_3$, respectively.

Here, when the gate width of the switch FET 5 is 500 μm, if the attenuation rates of 4, 6 and 8 dB are required by operating the three normally-on FETs $23_1$, $23_2$ and $23_3$, respectively, the gate widths of the normally-on FETs $23_1$, $23_2$ and $23_3$ become 8, 16 and 32 μm, respectively. Here, however, the attenuation rates are assumed to be proportional to the gate widths of the normally-on FETs $23_1$, $23_2$ and $23_3$.

Figure 9:
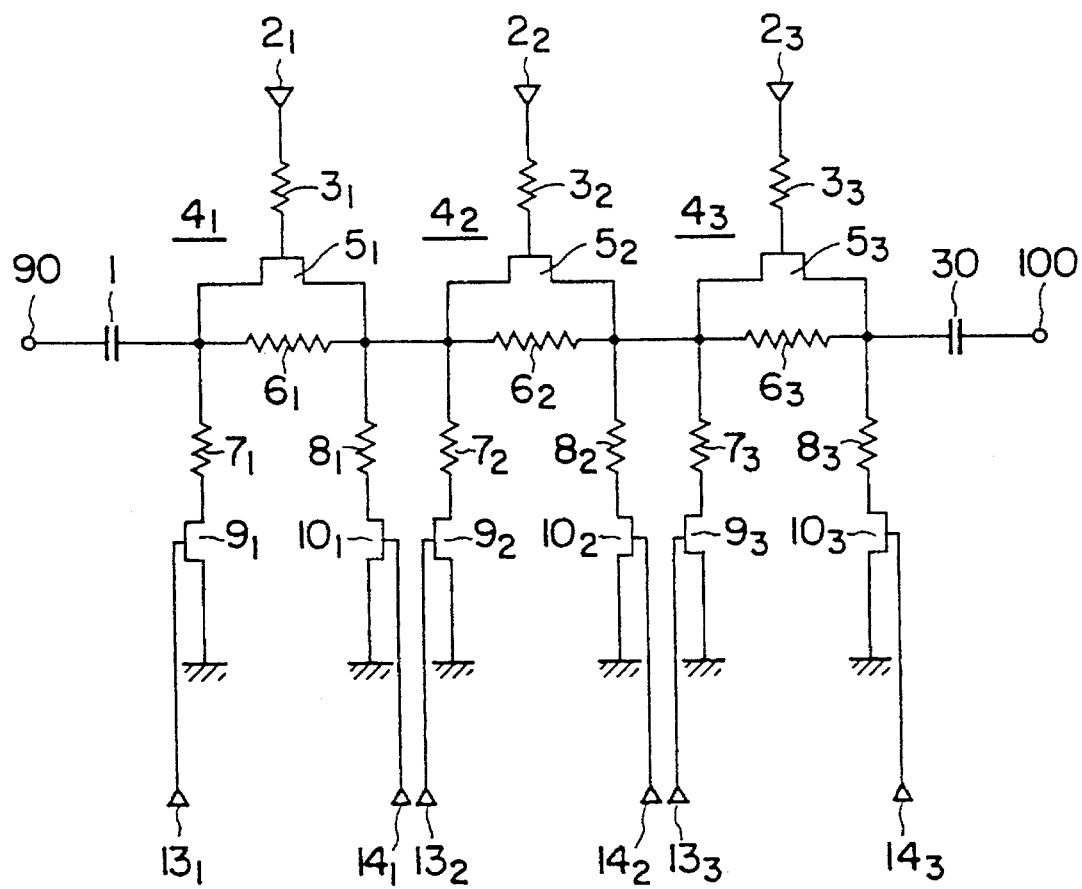
FIG. 9 is a circuit diagram showing a prior art π-type variable attenuator.
Figure 10:
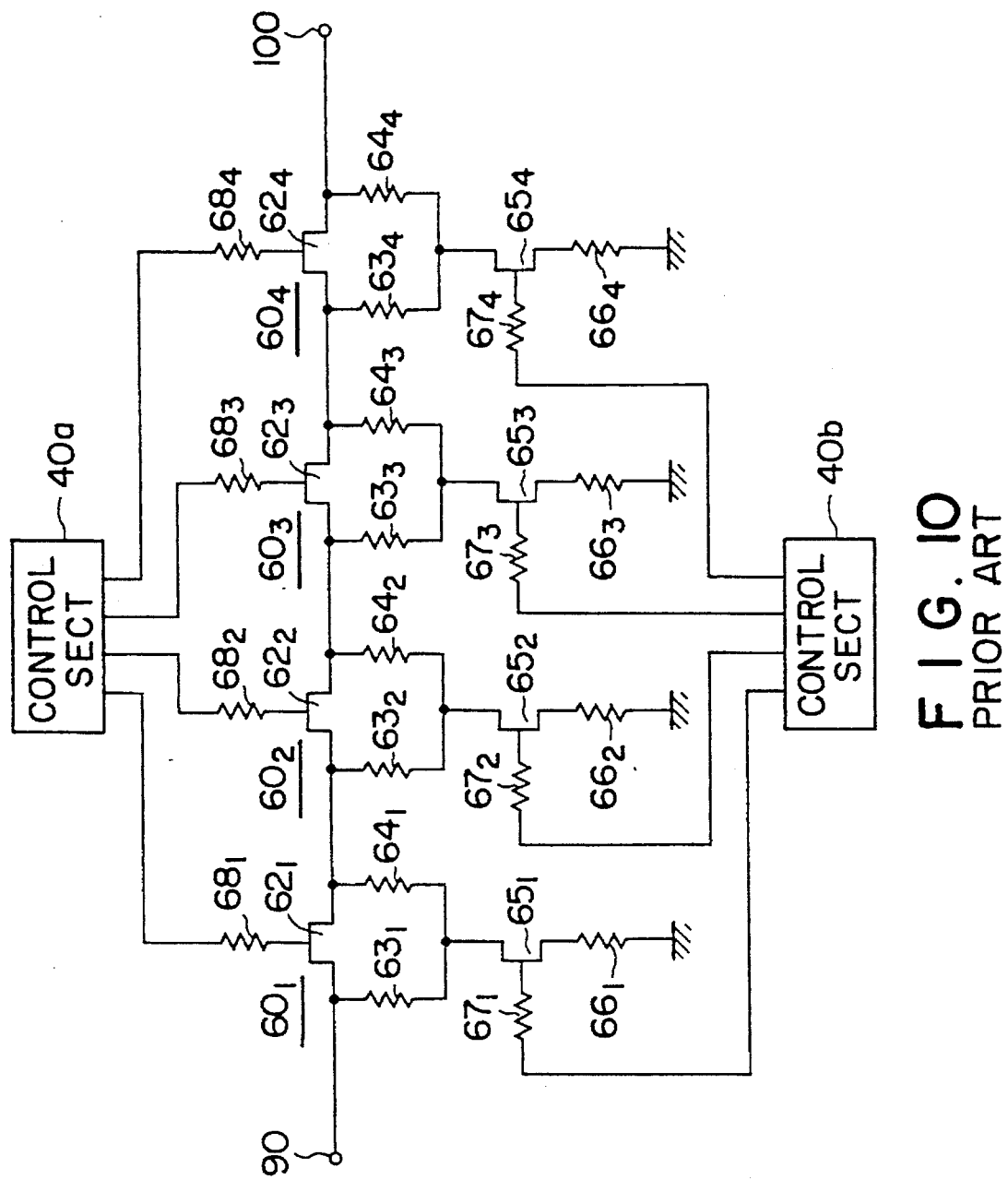
FIG. 10 is a circuit diagram showing a prior art T-type variable attenuator.

In the case of the prior art variable attenuator as shown in FIG. 9, the attenuation rate from 4 to 28 dB is obtained by use of three unit step attenuators. In comparison with this, in the present invention, the same attenuation rates can be obtained by use of only a single unit step attenuator 4, three transfer gates $22_1$, $22_2$ and $22_3$, and three normally-on FETs $23_1$, $23_2$ and $23_3$, so that it is possible to reduce the layout area, as compared with the prior art device.

Further, in the attenuator device according to the present invention, since the signal transmission loss is caused by only the turn-on resistance of the switch FET 5, it is possible to reduce the loss down to about ⅓ of that of the prior art device.

Figure 2:
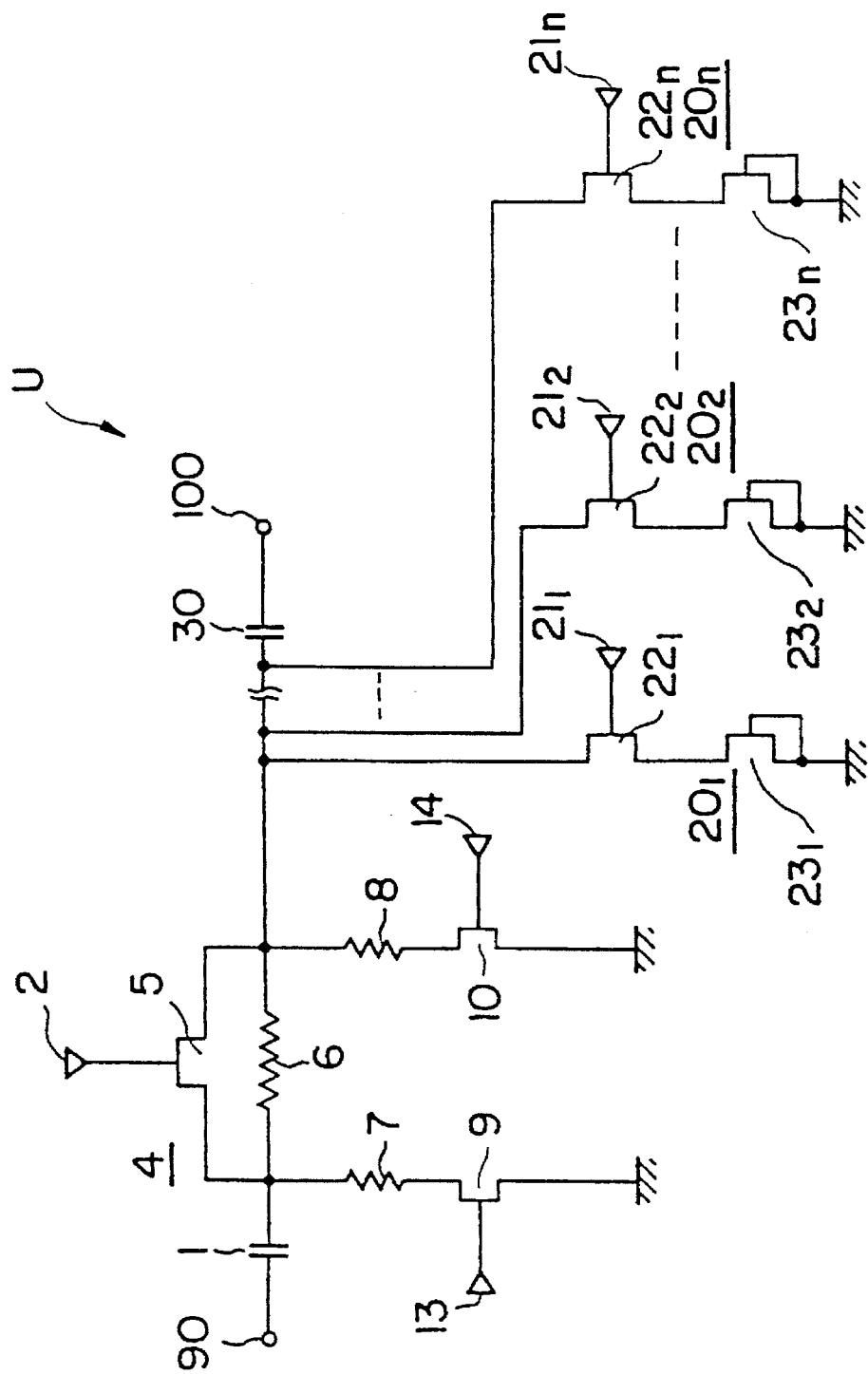
FIG. 2 is a circuit diagram showing a modification example of the attenuator device shown in FIG. 1.
Figure 2A:
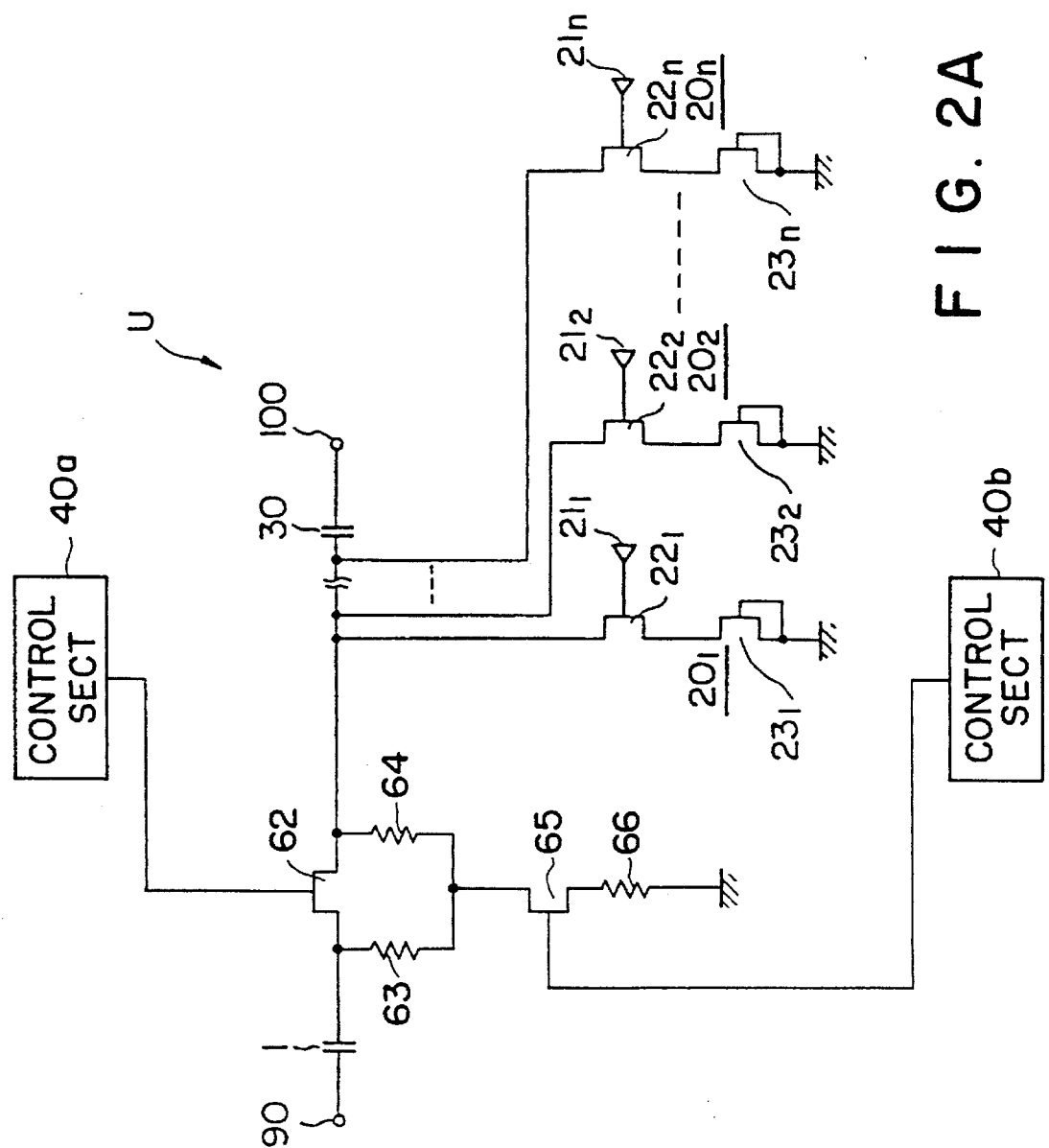
FIG. 2A is a circuit diagram showing a modification example in which the unit step attenuator shown in FIG. 2 is changed from the π type to T type.
Figure 3:
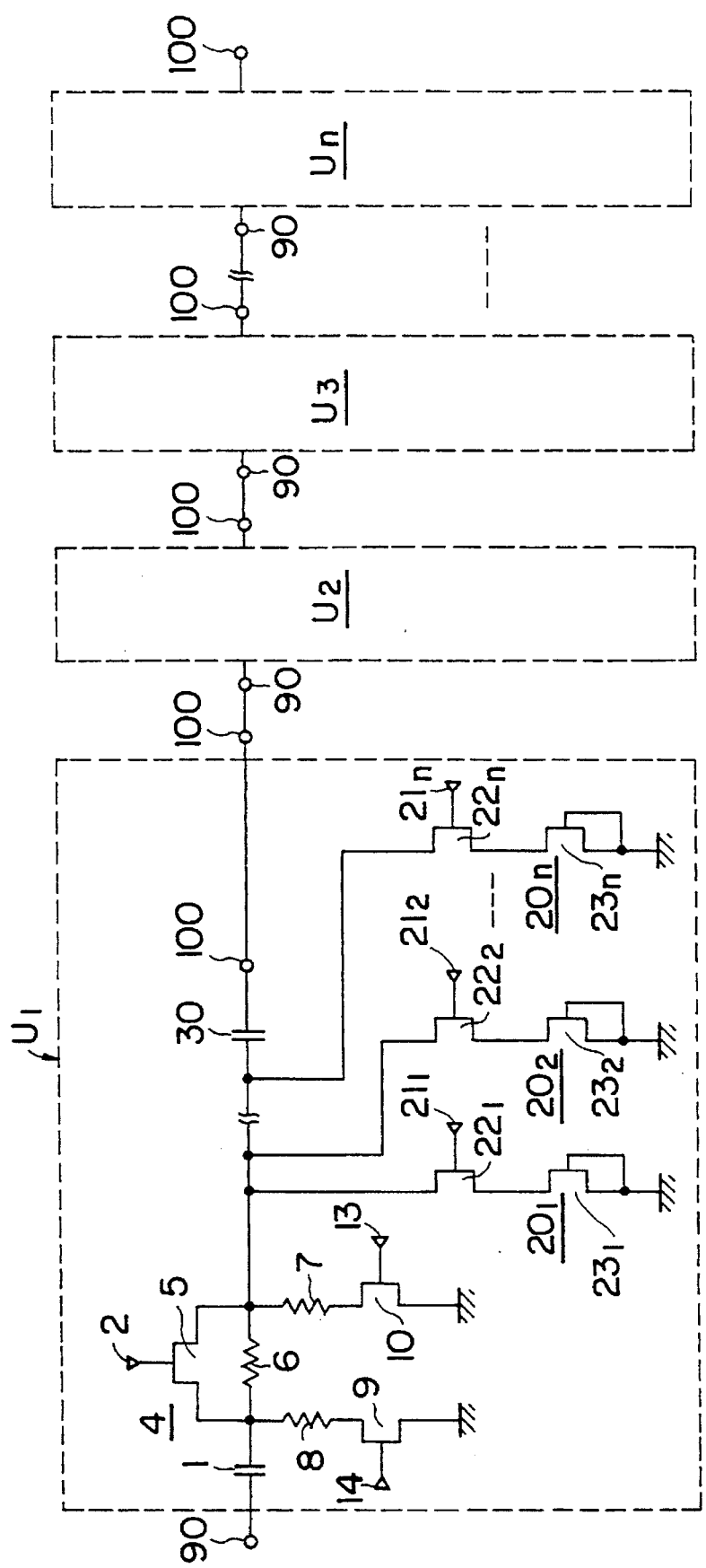
FIG. 3 is a circuit diagram showing an example in which the attenuator device shown in FIG. 2 is used.
Figure 3A:
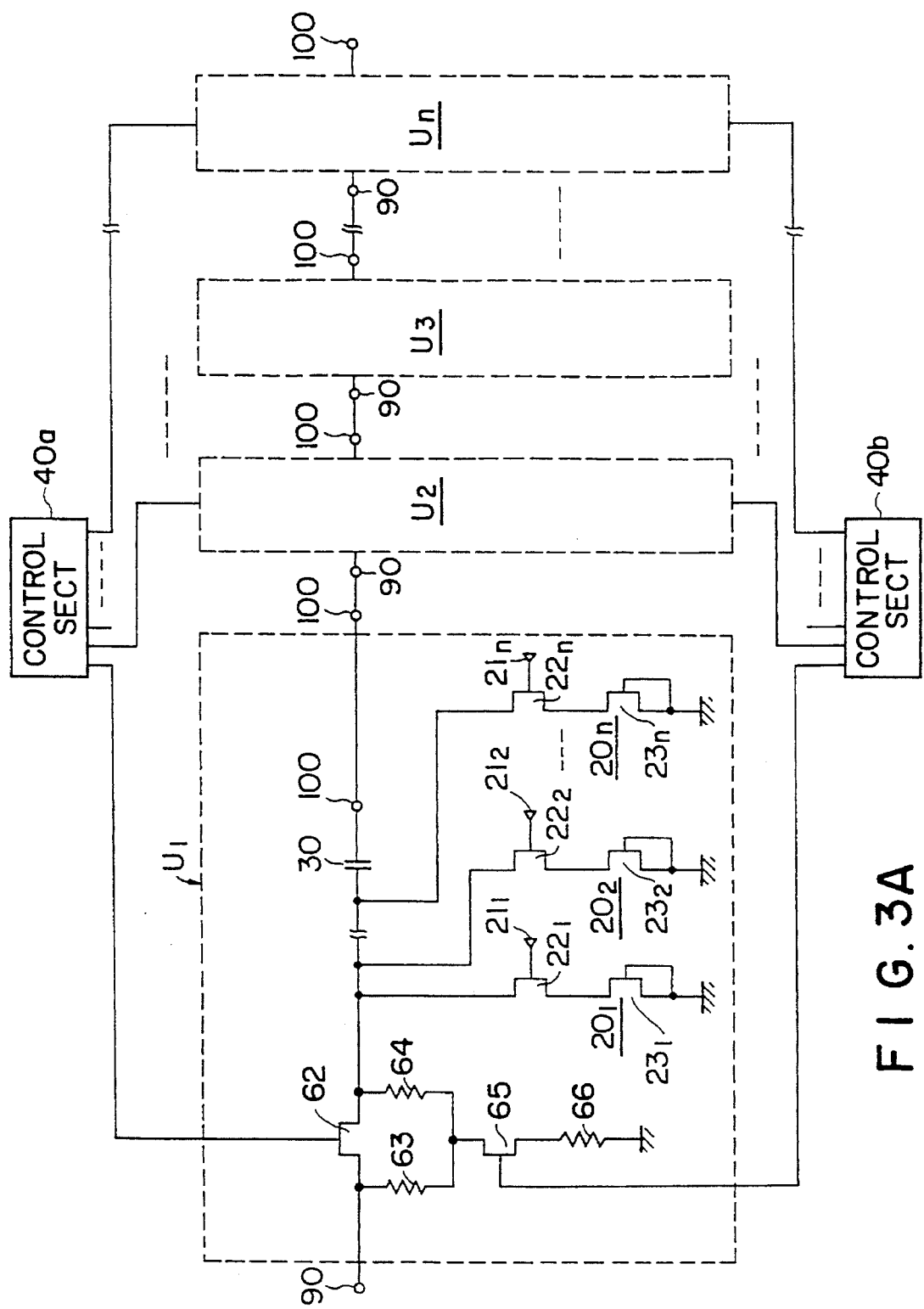
FIG. 3A is a circuit diagram showing a modification example in which the unit step attenuator shown in FIG. 3 is changed from the π type to T type.

In the case shown in FIG. 1, three-units of the current source circuits $20_1$, $20_2$ and $20_3$ are used. Without being limited only thereto, however, it is possible to use n-units of current source circuits 20. In this case, the n-units of normally-on FETs ($23_1$ to $23_n$) in which all the gate widths thereof differ from each other can be used. Or else, the n-units of normally-on FETs ($23_1$ to $23_n$) in which a plurality of gate widths thereof are equal to each other can be used. FIG. 3 shows another embodiment of the present invention. In FIG. 3, each of units $U_1$, $U_2$, $U_3$, . . . , $U_n$ is the unit U shown in FIG. 2.

FIG. 4 shows a second embodiment of the attenuator device according to the present invention, which is used as a variable attenuator for an analog circuit. The attenuator device shown in FIG. 4 comprises three series-connected unit step attenuators $4_1$, $4_2$ and $4_3$, and two pull-down FETs $32_1$ and $32_2$. Each unit step attenuator $4_i$ (i=1, 2 and 3) is composed of a switch FET $5_i$, a attenuation resistor $6_i$ connected in parallel to the FET $5_i$, two shut-down resistors $7_i$ and $8_i$, and transfer gates $9_i$ and $10_i$ connected in series to the shut-down resistors $7_i$ and $8_i$, respectively. In each unit step attenuator $4_i$ (i=1, 2 and 3), the attenuation resistor $6_i$ and the two shut-down resistors $7_i$ and $8_i$ are arranged into π shape. Three control signals are inputted from a control section 40a to the gates of the switch FETs $5_1$, $5_2$ and $5_3$, respectively, and six control signals are inputted from another control section 40b to the gates of the transfer gates $9_1$, $10_1$; $9_2$, $10_2$; and $9_3$, $10_3$;, respectively.

The drain of the pull-down FETs $32_1$ is connected to a junction point between the two unit step attenuators $4_1$ and $4_2$ to control the on/off resistance of the switch FET $5_i$ and the on/off resistance of the transfer gates $9_i$ and $10_i$ of the unit step attenuator $4_i$ (i=1, 2 and 3). Further, the drain of the pull-down FETs $32_2$ is connected to a junction point between the two unit step attenuators $4_2$ and $4_3$ to control the on/off resistance of the switch FET $5_i$ and the on/off resistance of the transfer gates $9_i$ and $10_i$ of the unit step attenuator $4_i$ (i=2 and 3). Therefore, under consideration of dispersion of the characteristics of the FETs $5_i$, $9_i$ and $10_i$ due to fluctuations during the manufacturing process, it is possible to control the current flowing through the FETs $5_i$, $9_i$ and $10_i$ by use of the FETs $32_1$ and $32_2$, so that the attenuation rate error among the respective unit step attenuators $4_i$ can be reduced.

In the prior art attenuator, when the attenuation rates from 4 to 28 dB are required, in order to reduce the attenuation rate error at the maximum attenuation rate (=28 dB), the attenuator device is constructed by four unit step attenuators by adding one unit step attenuator excessively. In the second embodiment, however, it is possible to construct the attenuator device by three unit step attenuators and two FETs. As a result, the signal transmission loss can be reduced, and further the layout area can be also reduced, as compared with the conventional one.

Figure 5A:
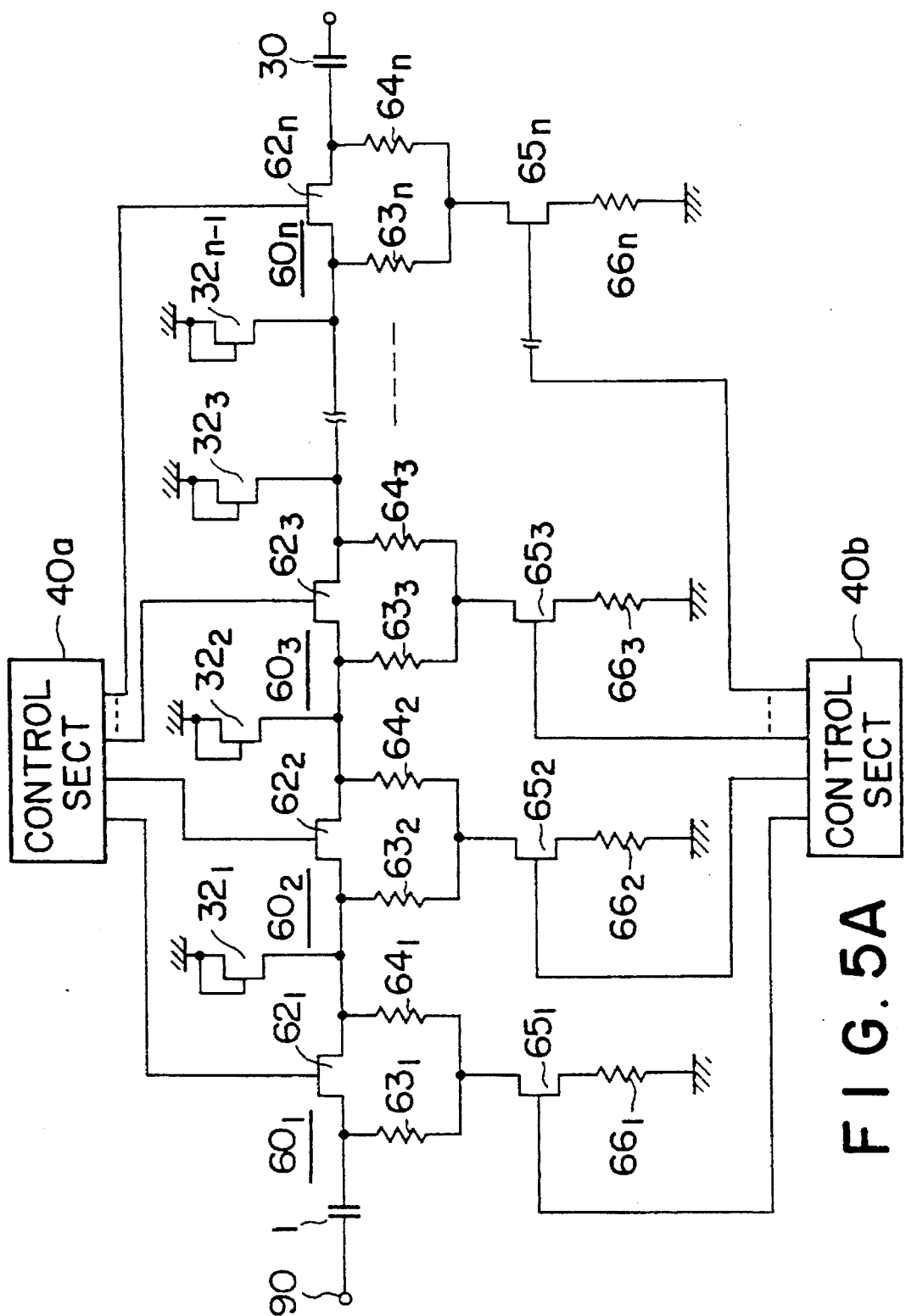
FIG. 5A is a circuit diagram showing a modification example in which the unit step attenuator shown in FIG. 5 is changed from the π type to T type.

In the case shown in FIG. 4, three-units of unit step attenuators ($4_1$ to $4_3$) are used. Without being limited only thereto, it is possible to use n-units of unit step attenuators ($4_1$ to $4_n$) as shown in FIG. 5. In this case, the n-units of unit step attenuators ($4_1$ to $4_n$) in which all the attenuation rates thereof differ from each other can be used. Or else, the n-units of unit step attenuators ($4_1$ to $4_n$) in which a plurality of the attenuation rates thereof are equal to each other can be used.

Further, in the above-mentioned first and second embodiments as shown in FIGS. 1, 2, 3, 4 and 5, although the unit step attenuator of π-type has been explained, it is of course possible to construct the attenuator device by use of T-type unit step attenuator or attenuators as shown in FIGS. 1A, 2A, 3A, 4A and 5A.

Further, in the first and second embodiments, since the gate current of the switch FET is controlled by the normally-on FET, it is possible to eliminate the high resistance resistor ($3_1$ to $3_3$ in FIG. 9) required to reduce the gate current in the prior art device.

FIG. 6 shows a third embodiment of the attenuator device according to the present invention, which is used as a variable attenuator of an analog circuit. The attenuator device comprises three unit step attenuators $4_1$, $4_2$ and $4_3$ and two switch transfer gates 50 and 52. Each unit step attenuator $4_i$ can be constructed by that shown in FIG. 9 or FIG. 4.

The transfer gate 50 is connected directly to the unit step attenuator $4_1$. On the other hand, the transfer gate 52 is connected in parallel to a serial circuit composed of the transfer gate 50 and three unit step attenuators $4_1$, $4_2$ and $4_3$. Further, two complementary signals are transmitted from the control section 45 to the two transfer gates 50 and 52, respectively to turn on one of them and off the other of them.

When the unit step attenuators $4_1$, $4_2$ and $4_3$ are not used as the attenuators, the transfer gate 50 is turned off and the transfer gate 52 is turned on by the control signals applied by the control section 45. Therefore, an RF signal inputted through an input terminal 90 is outputted from an output terminal 100 through only the transfer gate 52, with the result that the signal transmission loss can be determined by only the turn-on resistance of the transfer gate 52. On the other hand, when the unit step attenuators $4_1$, $4_2$ and $4_3$ are used as the attenuators, the transfer gate 50 is turned on and the transfer gate 52 is turned off. In this case, any desired attenuation rate can be obtained by combining the unit step attenuators $4_1$, $4_i$ and $4_3$ appropriately.

In this third embodiment, even if the required attenuation rates increase; that is, the number of the unit step attenuators increases, since the signal transmission loss can be determined by only the turn-on resistance of the transfer gate 52, it is possible to reduce the signal transmission loss, as compared with the prior art device. Further, since the transmission loss is small, it is unnecessary to widen the gate width of the switch FET for constituting each unit step attenuator as with the case of the prior art device, so that it is possible to reduce the layout area.

Figure 7:
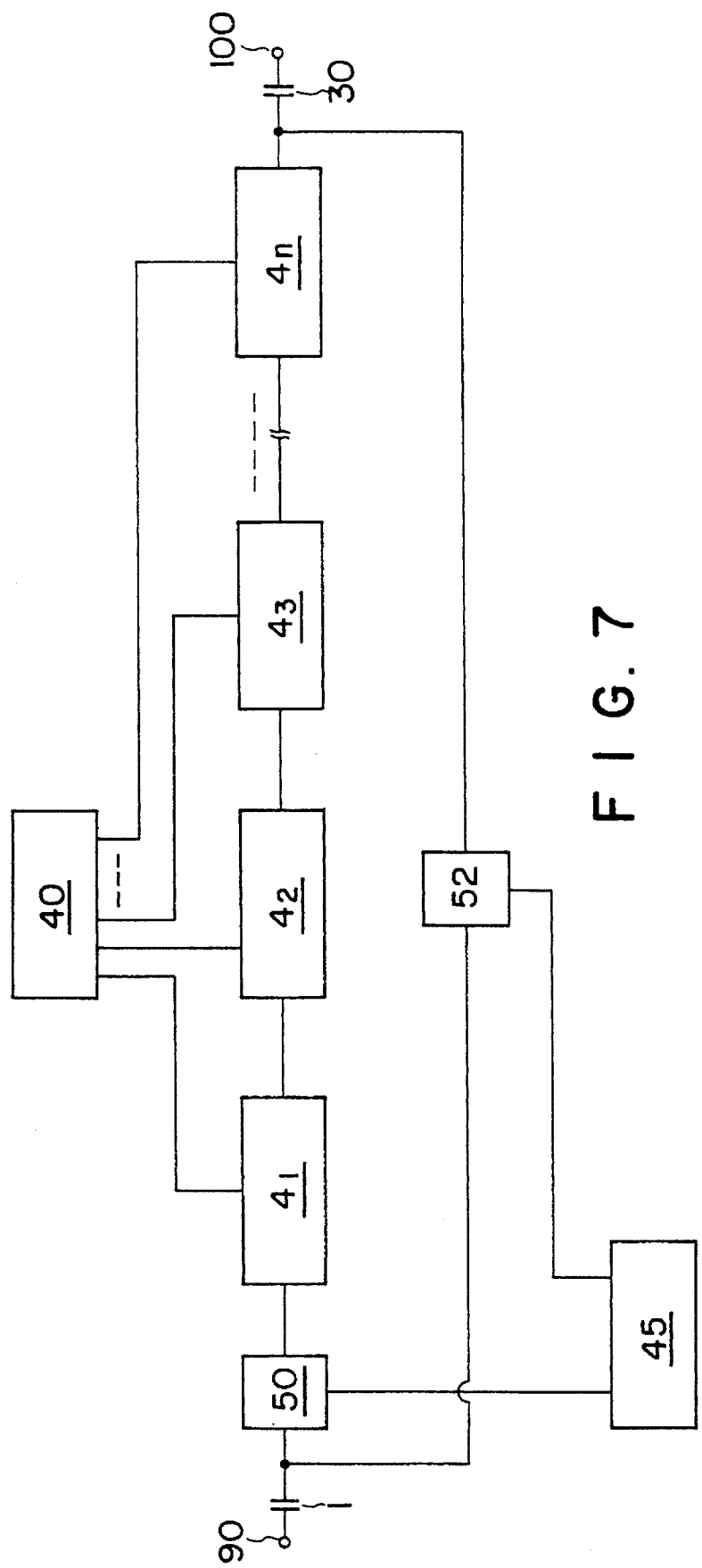
FIG. 7 is a circuit diagram showing a modification of the attenuator device shown in FIG. 6.
Figure 8:
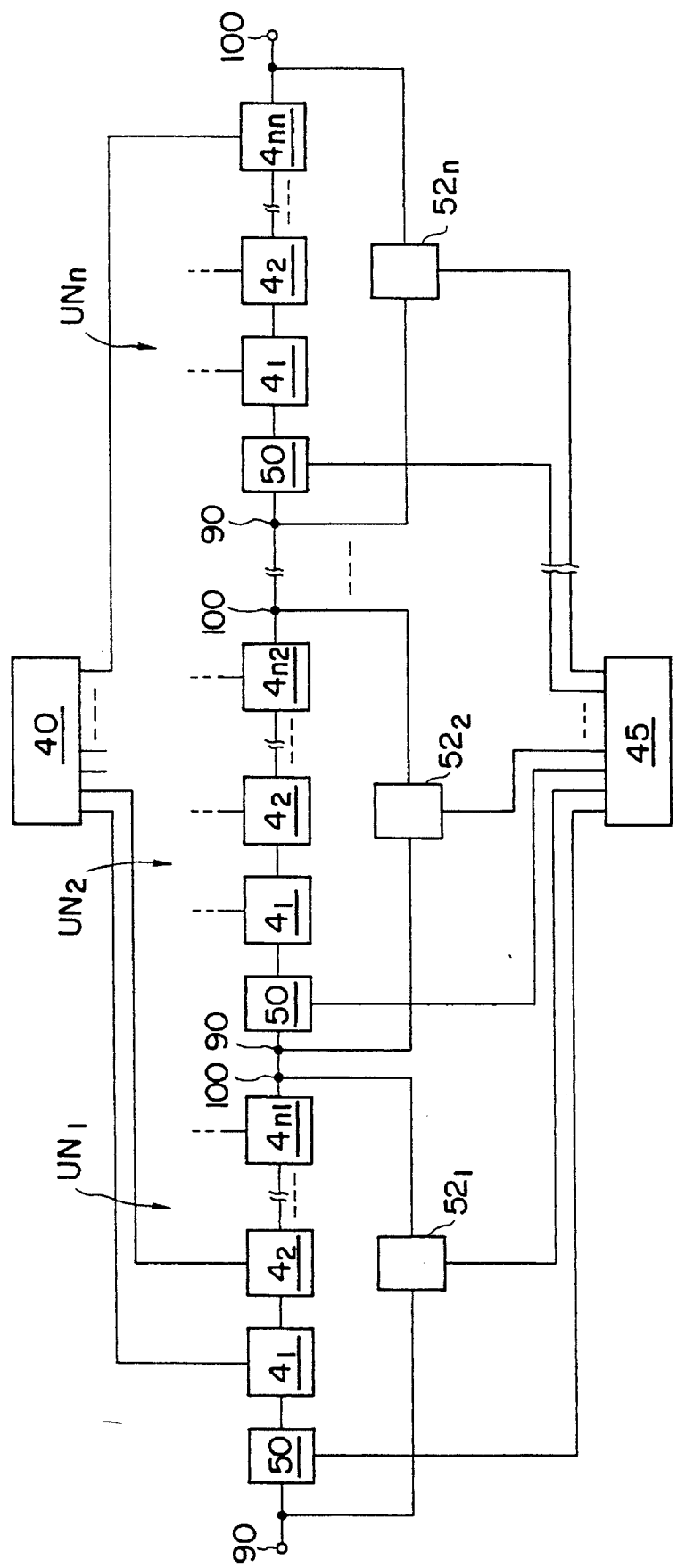
FIG. 8 is a circuit diagram showing an example in which the attenuator device shown in FIG. 7 is used.

Further, in the case shown in FIG. 6, three-units of unit step attenuators ($4_1$ to $4_3$) are used. Without being limited only thereto, it is possible to use n-units of unit step attenuators ($4_1$ to $4_n$) as shown in FIG. 7. Further, it is also possible to connect m-units of units UN ($UN_1$ to $UN_m$) in series, as shown in FIG. 8.

Further, the attenuator device according to the present invention can be used as an analog circuit for a movable communication apparatus, in particular for a portable telephone set. As described above, in the attenuator device according to the present invention, it is possible to reduce the signal transmission loss and the layout area as much as possible, even if various attenuation rates are required.

What is claimed is:

1. An attenuator device, comprising:

an input terminal;

an output terminal;

one unit step attenuator having a switch FET connected between said input and output terminals, a control terminal of the switch FET being connected directly to a control signal terminal without having an intervening resistor; and a plurality of current source circuits each for turning on/off an output side of the switch FET through a current path of a predetermined size, at a supply voltage terminal thereof, to control gate current flowing through the switch FET and to control an ON-state resistance of the switch FET, wherein at least one of said current source circuits is turned on.

2. The attenuator device of claim 40, wherein said unit step attenuator is of $\pi$ type and which comprises:

a first resistor connected between said input terminal and said output terminal;

a second resistor connected between an input side of said first resistor and the supply voltage terminal; and a third resistor connected between an output side of said first resistor and the supply voltage terminal.

3. The attenuator device of claim 1, wherein said unit step attenuator is of T type and which comprises:

a first resistor connected at one end to an input side of the switch FET;

a second resistor connected at one end to an output side of the switch FET; and a third resistor connected at one end to the other ends of said first and second resistors, and connected at the other end to the supply voltage terminal.

4. The attenuator device of claim 1, wherein said plurality of said current source circuits have current paths of predetermined different sizes, respectively.

5. The attenuator device of claim 2, wherein said plurality of said current source circuits have current paths of predetermined different sizes, respectively.

6. The attenuator device of claim 3, wherein said plurality of said current source circuits have current paths of predetermined different sizes, respectively.

7. The attenuator device of claim 1, wherein said plurality of said current source circuits have current paths of predetermined different sizes, respectively, and the number of current source circuits having the current path of a certain size is at least one.

8. The attenuator device of claim 2, wherein said plurality of said current source circuits have current paths of predetermined different sizes, respectively, and the number of current source circuits having the current path of a certain size is at least one.

9. The attenuator device of claim 3, wherein said plurality of said current source circuits have current paths of predetermined different sizes, respectively, and the number of current source circuits having the current path of a certain size is at least one.

10. The attenuator device of claim 1, wherein each of said current source circuits is a series circuit of a switching element and a normally-on transistor, the size of the current path being determined by said normally-on transistor.

11. The attenuator device of claim 2, wherein each of said current source circuits is a series circuit of a switching element and a normally-on transistor, the size of the current path being determined by said normally-on transistor.

12. The attenuator device of claim 3, wherein each of said current source circuits is a series circuit of a switching element and a normally-on transistor, the size of the current path being determined by said normally-on transistor.

13. The attenuator device of claim 5, wherein switching elements are connected in series with said second and third resistors, respectively.

14. The attenuator device of claim 8, wherein switching elements are connected in series with said second and third resistors, respectively.

15. The attenuator device of claim 11, wherein switching elements are connected in series with said second and third resistors, respectively.

16. The attenuator device of claim 6, wherein a switching element is connected in series with said second resistor.

17. The attenuator device of claim 9, wherein a switching element is connected in series with said second resistor.

18. The attenuator device of claim 12, wherein a switching element is connected in series with said second resistor.

19. An attenuator device, comprising:

a plurality of attenuator units connected in series sequentially, each of said attenuator units comprises:

an input terminal;

an output terminal;

one unit step attenuator having a switch FET connected between said input and output terminals, a control terminal of the switch FET being connected directly to a control signal terminal without having an intervening resistor; and a plurality of current sources each for turning on/off an output side of the switch FET through a current path of a predetermined size, at a supply voltage terminal thereof, to control gate current flowing through the switch FET, and to control an ON-state resistance of the switch FET, wherein at least one of said current source circuits is turned on.

20. The attenuator device of claim 19, wherein said unit step attenuator is of $\pi$ type and which comprises:

a first resistor connected between said input terminal and said output terminal;

a second resistor connected between an input side of said first resistor and the supply voltage terminal; and a third resistor connected between an output side of said first resistor and the supply voltage terminal.

21. The attenuator device of claim 19, wherein said unit step attenuator is of T type and which comprises:

a first resistor connected at one end to an input side of the switch FET;

a second resistor connected at one end to an output side of the switch FET; and a third resistor connected in common at one end to the other ends of said first and second resistors, and connected at the other end to the supply voltage terminal.

* * * * *